United States Patent
Terao

[19]

[11] Patent Number: 5,946,332
[45] Date of Patent: Aug. 31, 1999

[54] LASER HAVING A CONNECTION DETECTOR FOR MONITORING A CONNECTION BETWEEN SEPARATED OSCILLATOR AND POWER UNITS

[75] Inventor: Tsutomu Terao, Tokyo, Japan

[73] Assignee: NEC Corporation, Tokyo, Japan

[21] Appl. No.: 08/937,604

[22] Filed: Sep. 25, 1997

[30] Foreign Application Priority Data

Sep. 27, 1996 [JP] Japan ................................. 8-256931

[51] Int. Cl.$^6$ ........................................................ H01S 3/00
[52] U.S. Cl. .................................. 372/33; 372/34; 372/38
[58] Field of Search .............................. 372/33–36, 38, 372/109; 324/754–764

[56] References Cited

U.S. PATENT DOCUMENTS

| | | | |
|---|---|---|---|
| 4,950,268 | 8/1990 | Rink | 372/33 X |
| 5,379,145 | 1/1995 | Nodine | 372/33 X |

FOREIGN PATENT DOCUMENTS

| | | |
|---|---|---|
| 60-223179 | 11/1985 | Japan . |
| 6-223950 | 8/1994 | Japan . |

*Primary Examiner*—John D. Lee
*Attorney, Agent, or Firm*—Young & Thompson

[57] ABSTRACT

A connection monitoring system is provided for monitoring a connection between separated oscillator and power units not only in an initial time period just after the connector has been connected to the interface but also in a time period when the laser is in serve for allowing a long life time of the laser by preventing the laser oscillator unit from an excess large load even if a connector is incompletely connected to an interface of the electric device or if a connector pin is incompletely in contact with the interface. A thermal switch recognition system is further provided for recognizing excess temperature increase of the laser tube which can ascertain which thermal switch has been opened for allowing a long life-time of the laser tube by recognizing a position where an excess temperature increase appears.

4 Claims, 2 Drawing Sheets

5,946,332

LASER HAVING A CONNECTION DETECTOR FOR MONITORING A CONNECTION BETWEEN SEPARATED OSCILLATOR AND POWER UNITS

BACKGROUND OF THE INVENTION

The present invention relates to a laser, and more particularly to a laser having a connection detector for detecting a connection between separated oscillator and power units.

In the prior art, the connection detector may comprise a misconnection detecting circuit for detecting a misconnection of cables between separated oscillator and power units in the laser. In the Japanese laid-open patent publication No. 6-223950, it is disclosed that when a connector of a cable is connected to an interface of an electronic device, then a signal is generated by the electronic device and transmitted to a certain terminal of the interface. The connector receives this signal and then generates an identification signal in accordance with the received signal. The identification signal will be returned to the electronic device. The electronic device receives the identification signal from the connector and then confirm a correspondence of the actual identification signal to previously registered identification signal in order to judge whether the correct connection was made or not.

The above conventional connection detecting system has the following two problems. First one is that the above conventional connection detecting system can not detect misconnection between the separated oscillation and power units when the laser is in operation. The meaning of misconnection includes when the connector is incompletely connected to the interface or when the connector pins are incompletely in contact with the interface. The above conventional connection detecting system can be in serve only in the initial time period just after the connector has been connected to the interface.

The second problem is in that the above conventional connection detecting system can not designate operating one of plural thermal switches connected in series to each other whereby it is impossible to ascertain a position of the misconnection.

In the above circumstances, it had been required to develop a novel connection monitoring system for monitoring a connection between separated oscillator and power units which is free from the above first and second problems.

SUMMARY OF THE INVENTION

Accordingly, it is an object of the present invention to provide a novel connection monitoring system for monitoring a connection between separated oscillator and power units which is free from the above first and second problems.

It is, therefore, an object of the present invention to provide a novel connection monitoring system for monitoring a connection between separated oscillator and power units not only in an initial time period just after the connector has been connected to the interface but also in a time period when the laser is in serve.

It is a further object of the present invention to provide a novel connection monitoring system for allowing a long life time of the laser by preventing the laser oscillator unit from an excess large load even if a connector is incompletely connected to an interface of the electric device or if a connector pin is incompletely in contact with the interface.

It is a still further object of the present invention to provide a novel thermal switch recognition system for recognizing excess temperature increase of the laser tube which can ascertain which thermal switch has been opened.

It is yet a further object of the present invention to provide a novel thermal switch recognition system for allowing a long life-time of the laser tube by recognizing a position where an excess temperature increase appears.

The above and other objects, features and advantages of the present invention will be apparent from the following descriptions.

The present invention provides a laser comprising a laser oscillator unit having a laser tube and a laser power unit connected to the laser oscillator unit by a connector for supplying a power to the laser tube for a laser emission. The laser power unit has a first monitoring system and the laser oscillator unit having a second monitoring system electrically connected to each other. After the laser oscillator unit and the laser power unit have been connected to each other by a connector, then the first monitoring system sends the second monitoring system an identification signal so that the second monitoring system sends the first monitoring system an answer signal to the identification signal whereby the first monitoring system refers the answer signal to a previously set signal to confirm a correspondence between the laser oscillator unit and the laser power unit, and if no correspondence is confirmed, then the first monitoring system instructs the laser power unit to discontinue to supply the power to the laser tube.

It is preferable that the first monitoring system comprises an identification signal setting and outputting circuit for setting an identification signal and then outputting the identification signal, and a comparator circuit for comparison of the answer signal with the previously set signal.

It is also preferable that the second monitoring system comprises an arithmetic circuit for operating the identification signal.

The present invention provides a laser comprising a laser oscillator unit having a laser tube and a laser power unit connected to the laser oscillator unit by a connector for supplying a power to the laser tube for a laser emission. The laser power unit has a first recognition system and the laser oscillator unit having a second recognition system electrically connected to each other. A plurality of thermal switches are provided around the laser tube. The above plurality of thermal switches are connected to the second recognition system in parallel to each other. The above plurality of thermal switches are operated by an excess temperature increase over a predetermined critical temperature. During when the laser is in operation, the second recognition system recognizes states of the plurality of thermal switches to recognize any excess temperature increase over the predetermined critical temperature and if the excess temperature increase appears, then the second recognition system sends the first recognition system an abnormal signal which identifies that the excess temperature increase has appeared so that the first recognition system instructs the laser power unit to discontinue to supply the power to the laser tube.

BRIEF DESCRIPTION OF THE DRAWINGS

Preferred embodiments according to the present invention will be described in detail with reference to the accompanying drawings.

PREFERRED EMBODIMENTS

First Embodiment

Figure 1:
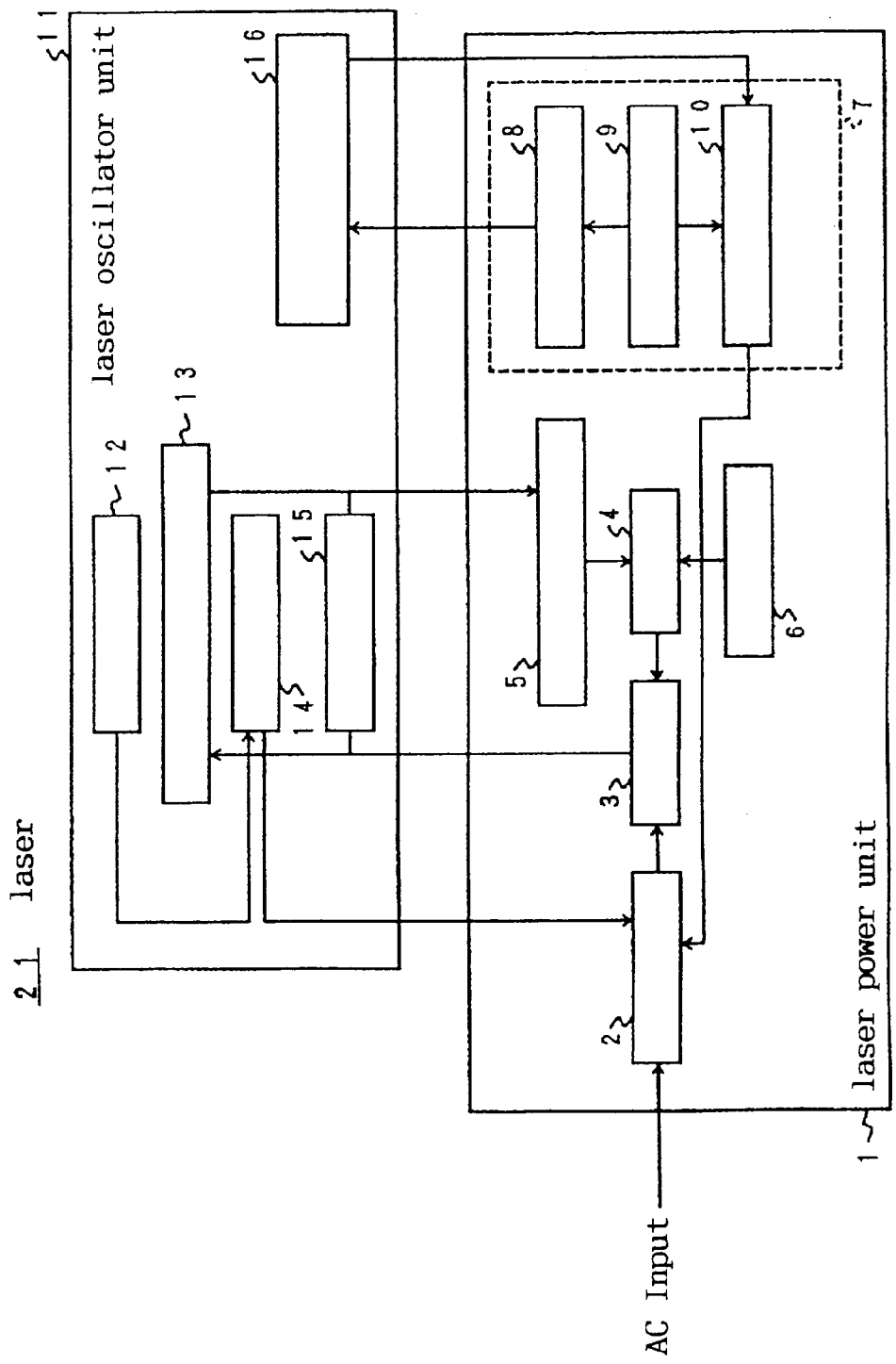
FIG. 1 is a block diagram illustrative of a novel laser comprising separated oscillator and power units with a monitoring system for monitoring correct connections between the separated oscillator and power units in a first embodiment according to the present invention.

A first embodiment according to the present invention will be described with reference to FIG. 1 which is a block diagram illustrative of a novel laser comprising separated oscillator and power units with a monitoring system for monitoring correct connections between the separated oscillator and power units in a first embodiment according to the present invention. A laser 21 comprises a laser oscillator unit 11 which emits a laser beam and a laser power unit 1 which is separated from the laser oscillator unit 11 but supplies a power to the laser oscillator unit 11 for driving the same. The laser oscillator unit 11 comprises the following elements. A laser tube 13 is provided which emits a laser beam. A starter circuit 15 is provided which is electrically connected to the laser tube 13 for applying a high voltage at an initial time for starting a laser emission. First and second thermal switches 12 and 14 are provided which are made open when the above laser tube 13 shows an excess temperature rise in operation. The first thermal switch 12 is connected to the second thermal switch 14. This second thermal switch 14 is further connected to the laser power unit 1. Any of the first and second thermal switches 12 and 14 is made open by the excess temperature rise of the laser tube 13 in operation, the laser power unit 1 can recognize the excess temperature rise of the laser tube 13 in operation. Further, an arithmetic unit 16 is provided which is connected to the laser power unit 1 for receiving an identification signal from the laser power unit 1 and carry out an operation of the received identification signal.

The laser power 1 has the following elements. An input control circuit 2 is provided which controls ON/OFF operations of the laser 21. A rectifier circuit 3 is provided which is connected to the input control circuit 2 for rectifying an AC current into a DC current. A driver circuit 4 is provided which is connected to the rectifier circuit 3 for driving the rectifier circuit 3. An output control circuit 6 is provided which is connected to the driver circuit 4 for controlling the driver circuit 4. A filament transducer 5 is provided which is connected to the laser tube 13 for applying an AC current to a filament in the laser tube 13 and in place receives a large discharge DC current. A connection monitor 7 is provided which is connected to the input control circuit 2 and also connected to the arithmetic circuit 16 in the laser oscillator unit 11. The connection monitor 7 does monitor the connection between the laser oscillator unit 11 and the laser power unit 1.

The connection monitor 7 provided in the laser power unit 1 comprises the following elements. An identification signal output circuit 8 is provided which is connected to the arithmetic circuit 16 in the laser oscillator unit 11 for supplying an identification signal to the arithmetic circuit 16 in the laser oscillator unit 11 at a predetermined constant time interval during the operation of the laser. An identification signal setting circuit 9 is provided which is connected to the identification signal output circuit 8 for setting the identification signal to be outputted from the identification signal output circuit 8. An arithmetic result comparing circuit 10 is provided which is connected to the arithmetic circuit 16 in the laser oscillator unit 11 and also connected to the input control circuit 2. The arithmetic result comparing circuit 10 receives the results of operations made by the arithmetic circuit 16 and then compares the received results of the operations to the previously set value. If no correspondence between the received results of the operations of the identification signal to the previously set value is confirmed by the arithmetic result comparing circuit 10, then the arithmetic result comparing circuit 10 sends a stop signal to the input control circuit 2 so that the input control circuit 2 stops the operations of the laser.

The reason why the identification signal is operated by the arithmetic circuit 16 is to distinguish many kinds of the laser oscillator units 11 and the laser power units 1 and also to prevent misidentification due to external noises.

The operations of the above laser 21 will subsequently be described. As described above, the identification signal is set by the identification signal setting circuit 9 and then the identification signal output circuit 8 sends the identification signal to the arithmetic circuit 16. The arithmetic circuit 16 performs a predetermined operation to the received identification signal and then returns the operation result to the arithmetic result comparing circuit 10. The arithmetic result comparing circuit 10 compares the received operation result to the previously set value. If no correspondence between the received results of the operations of the identification signal to the previously set value is confirmed by the arithmetic result comparing circuit 10, then the arithmetic result comparing circuit 10 sends a stop signal to the input control circuit 2 so that the input control circuit 2 stops the operations of the laser. If a correspondence between the received results of the operations of the identification signal to the previously set value is confirmed by the arithmetic result comparing circuit 10, then the arithmetic result comparing circuit 10 sends no stop signal to the input control circuit 2 so that the input control circuit 2 allows the laser to be in operation.

The connection monitor 7 and the arithmetic circuit 16 may comprise gate arrays. Signal transmissions between the laser oscillator unit 11 and the laser power unit 1 are made through a first output signal transmission line for transmitting the output signal from the laser power unit 1 to the laser oscillator unit 11, a second output signal transmission line for transmitting the output signal from the laser oscillator unit 11 to the output signal from the laser power unit 1, and a clock signal for transmitting clock signals. The above novel connection monitoring system provided in the laser is capable of monitoring a connection between separated oscillator and power units not only in an initial time period just after the connector has been connected to the interface but also in a time period when the laser is in serve. The above novel connection monitoring system allows a long life time of the laser by preventing the laser oscillator unit from an excess large load even if a connector is incompletely connected to an interface of the electric device or if a connector pin is incompletely in contact with the interface.

Second Embodiment

Figure 2:
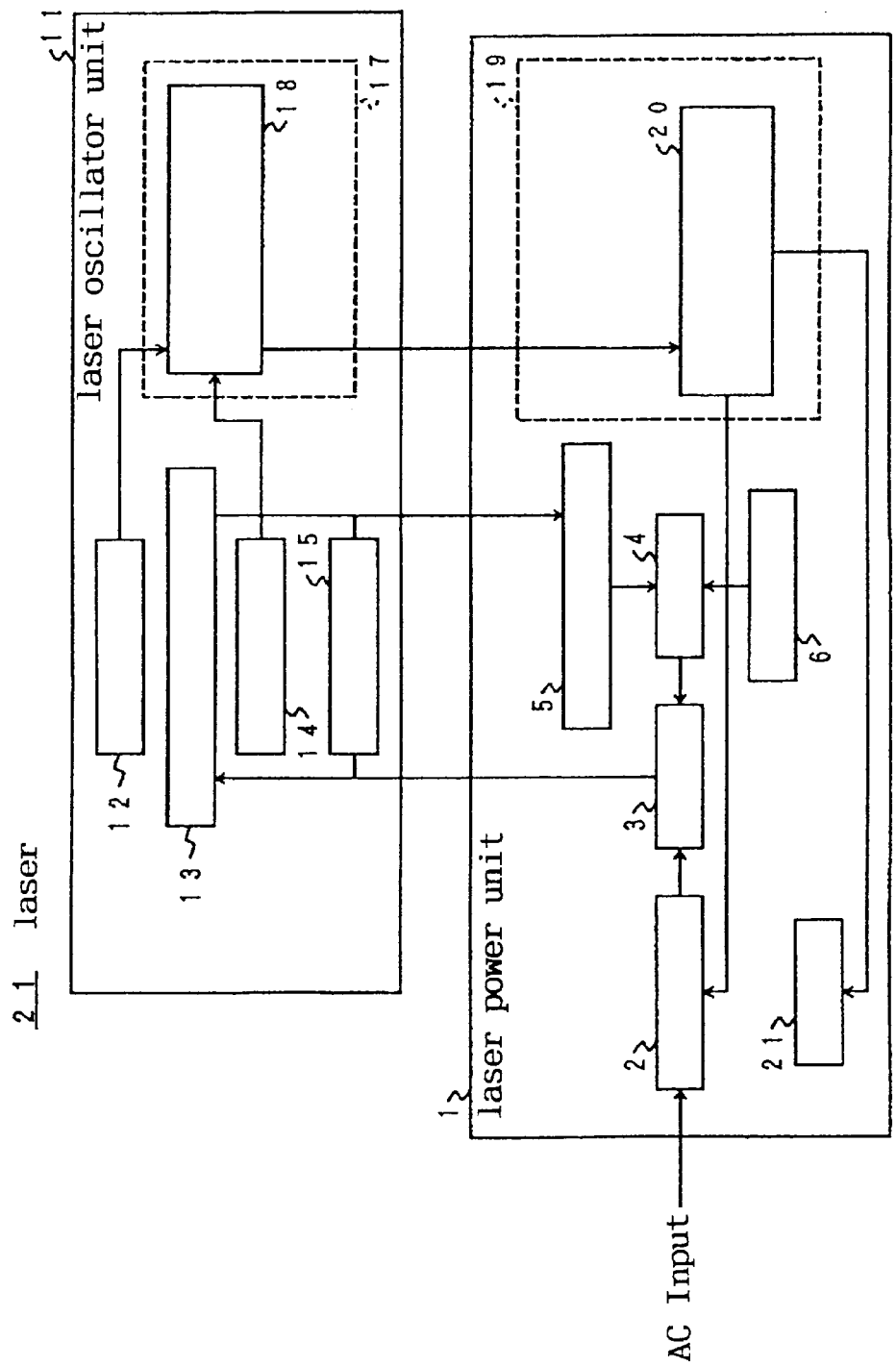
FIG. 2 is a block diagram illustrative of a novel laser comprising separated oscillator and power units with a thermal switch recognition system for recognizing excess temperature increase of the laser tube in a second embodiment according to the present invention.

A second embodiment according to the present invention will be described with reference to FIG. 2 which is a block diagram illustrative of a novel laser comprising separated oscillator and power units with a thermal switch recognition system for recognizing excess temperature increase of the laser tube in a second embodiment according to the present invention. A laser 21 comprises a laser oscillator unit 11 which emits a laser beam and a laser power unit 1 which is separated from the laser oscillator unit 11 but supplies a power to the laser oscillator unit 11 for driving the same. The laser oscillator unit 11 comprises the following elements. A laser tube 13 is provided which emits a laser beam. A starter circuit 15 is provided which is electrically connected to the laser tube 13 for applying a high voltage at an initial time for starting a laser emission. First and second thermal switches 12 and 14 are provided which are made open when the above laser tube 13 shows an excess temperature rise in operation. Any of the first and second thermal switches 12 and 14 is made open by the excess temperature rise of the laser tube 13 in operation, the laser power unit 1 can recognize the excess temperature rise of the laser tube 13 in operation. Further, a first semiconductor element 17 is provided which has a first thermal switch recognition circuit 18. The first thermal switch recognition circuit 18 is connected to the thermal switches 12 and 14 separately. Namely, the first and second thermal switches 12 and 14 are connected to the first thermal switch recognition circuit 18 in parallel to each other. The first and second thermal switches 12 and 14 are provided in contact with an insulator which is in contact with the laser tube 13 so that when the temperature of the laser tube is risen to a predetermined critical temperature, then the first and second thermal switches 12 and 14 are made open. The first thermal switch 12 is connected to a pair of electrodes provided in the first semiconductor element 17 having the first thermal switch recognition circuit 18. The second thermal switch 14 is also connected to a different pair of electrodes provided in the first semiconductor element 17 having the first thermal switch recognition circuit 18. The above different two pairs of the electrodes are connected in parallel to each other to the first and second thermal switches 12 and 14 separately. A switching mechanism is provided in the first semiconductor element 17 for selecting any one of the different two pairs of the electrodes so that the first thermal switch recognition circuit 18 can carry out sequential recognition operations for recognizing the open/close states of the first and second thermal switches 12 and 14.

The laser power 1 has the following elements. An input control circuit 2 is provided which controls ON/OFT operations of the laser 21. A rectifier circuit 3 is provided which is connected to the input control circuit 2 for rectifying an AC current into a DC current. A driver circuit 4 is provided which is connected to the rectifier circuit 3 for driving the rectifier circuit 3. An output control circuit 6 is provided which is connected to the driver circuit 4 for controlling the driver circuit 4. A filament transducer 5 is provided which is connected to the laser tube 13 for applying an AC current to a filament in the laser tube 13 and in place receives a large discharge DC current. A second semiconductor element 19 is provided which is connected to the input control circuit 2 and also connected to the first thermal switch recognition circuit 20 in the laser oscillator unit 11. The second semiconductor element 19 has a second thermal switch recognition circuit 20. A display 21 is provided which is connected to the second semiconductor element 19.

The operations of the above laser 21 will subsequently be described. As described above, when the first thermal switch recognition circuit 18 recognizes that the first or second thermal switch 12 or 14 has been opened, then the first thermal switch recognition circuit 18 sends the second thermal switch recognition circuit 20 abnormal signal which identifies the fact that the laser tube 13 has an excess temperature increase. The second thermal switch recognition circuit 20 sends the input control signal 2 a stop signal to stop or discontinue the operation of the laser emission. The second thermal switch recognition circuit 20 also sends the display 21 the abnormal signal so that the display 21 displays the abnormal state of the laser tube 13. The above novel connection monitoring system is capable of monitoring a connection between separated oscillator and power units which can ascertain which thermal switch has been opened. The above novel thermal switch recognition system is capable of recognizing excess temperature increase of the laser tube which can ascertain which thermal switch has been opened. This allows a long life-time of the laser tube by recognizing a position where an excess temperature increase appears.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A laser comprising a laser oscillator unit having a laser tube and a laser power unit connected to said laser oscillator unit by a connector for supplying a power to said laser tube for a laser emission, said laser power unit having a first monitoring system and said laser oscillator unit having a second monitoring system electrically connected to said first monitoring system, wherein after said laser oscillator unit and said laser power unit have been connected to each other by a connector, said first monitoring system sends said second monitoring system an identification signal so that said second monitoring system sends said first monitoring system an answer signal to said identification signal whereby said first monitoring system refers said answer signal to a previously set signal to confirm a correspondence between said laser oscillator unit and said laser power unit, and if no correspondence is confirmed, then said first monitoring system instructs said laser power unit to discontinue to supply said power to said laser tube.

2. The laser as claimed in claim 1, wherein said first monitoring system comprises an identification signal setting and outputting circuit for setting an identification signal and then outputting said identification signal, and a comparator circuit for comparison of said answer signal with said previously set signal.

3. The laser as claimed in claim 1, wherein said second monitoring system comprises an arithmetic circuit for operating said identification signal.

4. A laser comprising a laser oscillator unit having a laser tube and a laser power unit connected to said laser oscillator unit by a connector for supplying a power to said laser tube for a laser emission, said laser power unit having a first recognition system and said laser oscillator unit having a second recognition system electrically connected to said first recognition system, a plurality of thermal switches being provided around said laser tube, said plurality of thermal switches being connected to said second recognition system in parallel to each other, said plurality of thermal switches being operated by an excess temperature increase over a predetermined critical temperature, wherein during when said laser is in operation, said second recognition system recognizes states of said plurality of thermal switches to recognize any excess temperature increase over said predetermined critical temperature and if said excess temperature increase appears, then said second recognition system sends said first recognition system an abnormal signal which identifies that said excess temperature increase has appeared so that said first recognition system instructs said laser power unit to discontinue to supply said power to said laser tube.

* * * * *